United States
Jansen et al.

4,028,615
June 7, 1977

[54] METHOD OF AND DEVICE FOR TESTING HERMETICALLY ENCLOSED REED CONTACTS

[75] Inventors: Friedrich Ludwig Jansen; Frederik Hendrik Gerritsen; Johan Hendrik Adolph Glashörster, all of Hilversum, Netherlands

[73] Assignee: U.S. Philips Corporation, New York, N.Y.

[22] Filed: Oct. 16, 1975

[21] Appl. No.: 622,997

[30]       Foreign Application Priority Data

Sept. 1, 1975   Netherlands .................... 7510275

[52] U.S. Cl. .................. 324/28 RS; 324/34 RS; 73/70.2
[51] Int. Cl.² ................................. G01R 31/02
[58] Field of Search ...... 324/28 RS, 28 CR, 34 RS, 324/34 MA; 73/70, 70.2

[56]            References Cited
              UNITED STATES PATENTS

| | | | |
|---|---|---|---|
| 3,253,214 | 5/1966 | Heilweil | 324/28 RS |
| 3,743,927 | 7/1973 | Bridges | 324/28 RS |
| 3,745,447 | 7/1973 | Jaster | 324/28 RS |
| 3,822,398 | 7/1974 | Rovnyak | 324/28 RS |

*Primary Examiner*—Rudolph V. Rolinec
*Assistant Examiner*—Michael J. Tokar
*Attorney, Agent, or Firm*—Frank R. Trifari; David R. Treacy

[57]          ABSTRACT

Method of and apparatus for testing magnetostrictive reed contacts for poorly conductive surface contamination. The reed contact is closed in a magnetic field generated by a direct current. An alternating current is conducted through the closed reed contact, the frequency sweeping through the torsional resonant frequency of the contact reeds. The tested contact surface of the contact reeds is thus maximized. The voltage generated across the reed contact by the alternating current is then measured.

8 Claims, 12 Drawing Figures

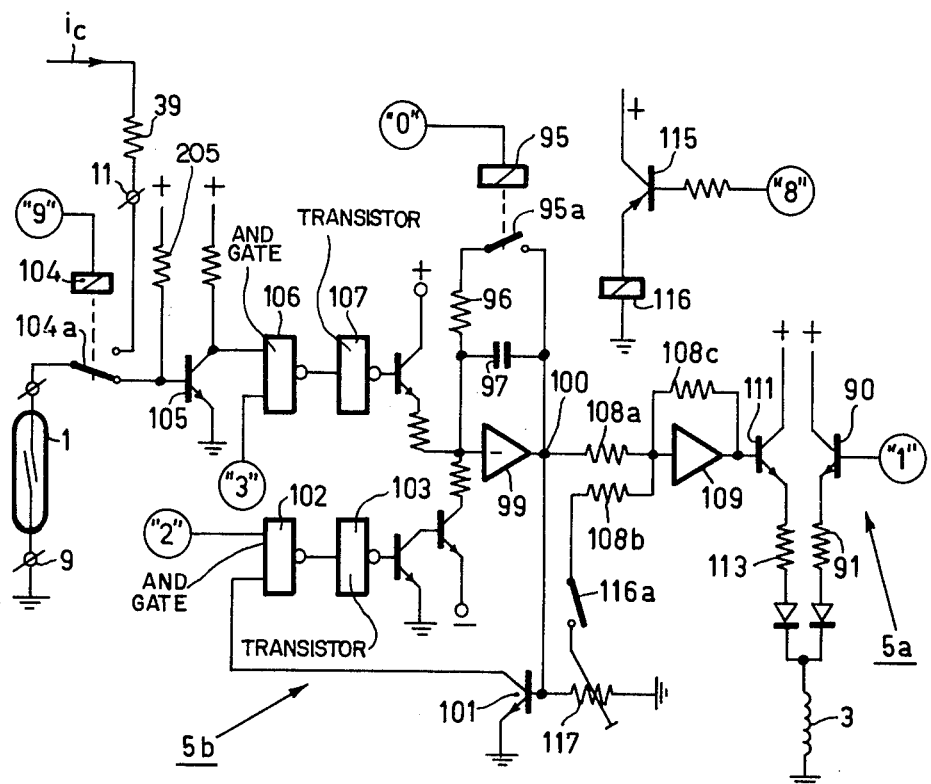
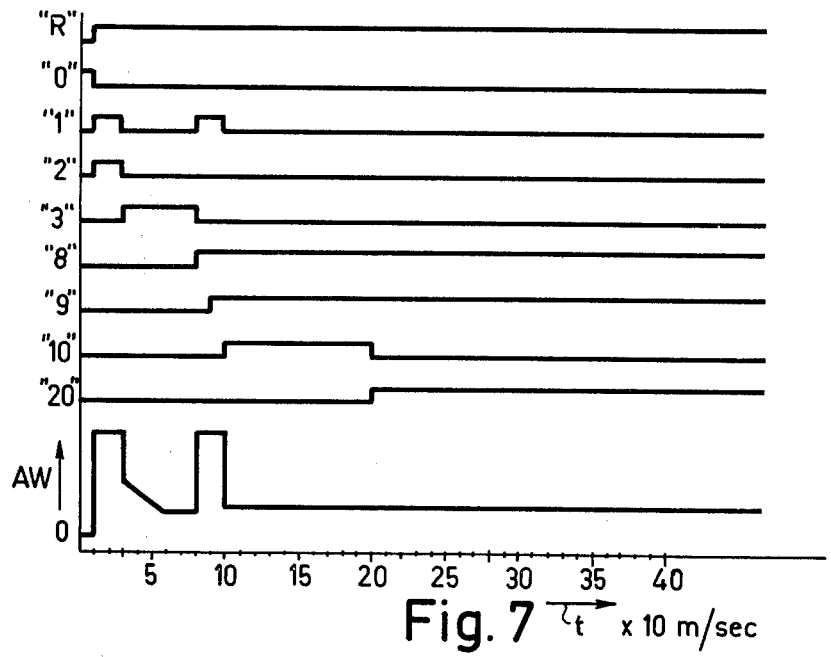
Fig. 6
Fig. 7  $t \rightarrow$ x 10 m/sec

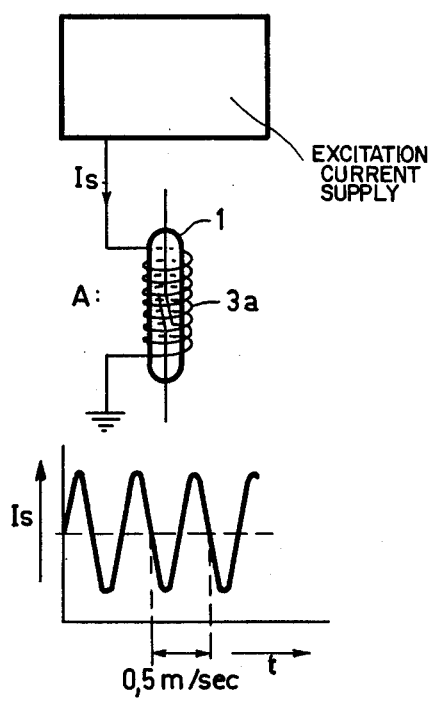
Fig.10 a
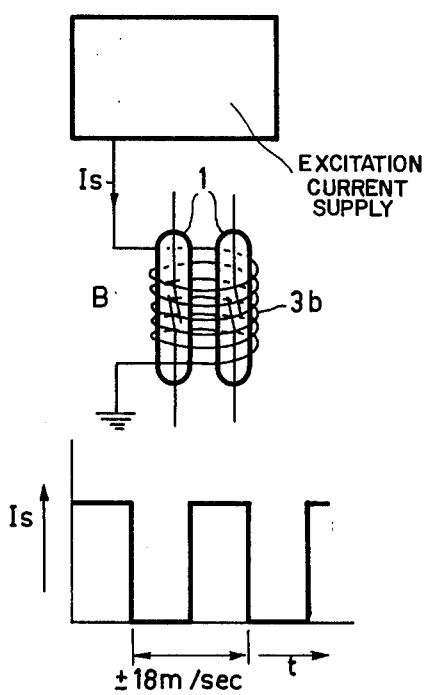
Fig.10 b
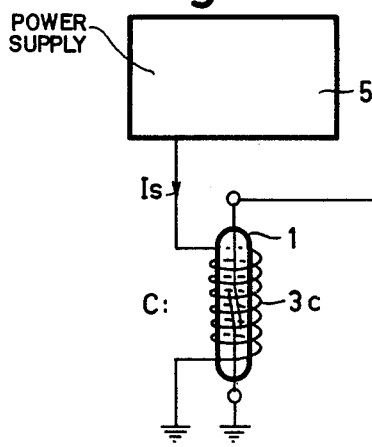
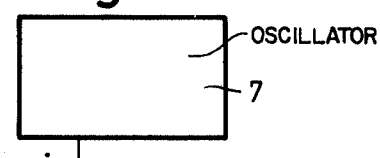
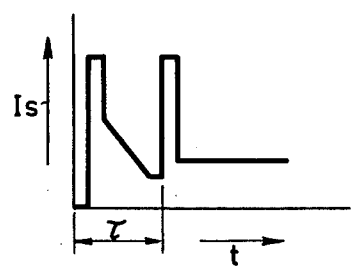
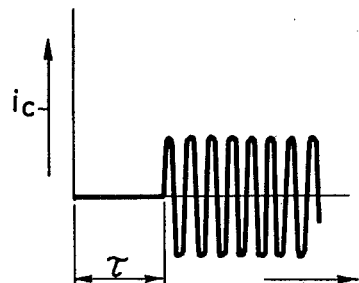
Fig.10 c

METHOD OF AND DEVICE FOR TESTING HERMETICALLY ENCLOSED REED CONTACTS

BACKGROUND OF THE INVENTION

1. Field of the Invention

The invention relates to a method of testing reed contacts for poorly conductive surface contamination, the electrically conductive contact reeds thereof consisting of magnetostrictive material and being arranged in an hermetically closed envelope, the reed contact being closed in the magnetic field of a coil. A test current which varies as a function of the time is conducted through the closed reed contact while an excitation current is conducted through the coil to hold the contact closed a voltage generated between ends of the reed contact by the test current being measured for some time and compared with a reference voltage. Further, the invention relates to a device for performing said method.

Surface contamination is to be understood to include dirt and dust particles, and other materials which are poor electrical conductors, and also oxide skins and insulating layers which may be present on the contact surface after the manufacture of reed contacts.

2. Description of the Prior Art

A method and a device of the kind set forth are described in U.S. Pat. No. 3,586,961. As disclosed in tht patent, the contact pressure counteracts the torsional movement of the reeds which is caused by magnetostriction. The surface which is tested during the torsional movement is limited. Even though the contact pressure is chosen to be as low as possible, because of the spread in the rigidity of the various contacts the contact pressure must still be chosen so high that the torsional movement is substantially counteracted. Use of a time-varying coil flux is not advantageous either, because this causes a changing contact pressure and hence a changing contact resistance. It is a logical consequence thereof that for appropriate acceptance/rejection of a reed contact accurate control of the detection signal, and hence comparatively expensive equipment, is required.

The surface examined could be increased by increasing the current which is conducted through the reed contact. However, this surface is limited because of the magnetostrictive properties of the reed contact.

SUMMARY OF THE INVENTION

The invention has for its object to provide a method and a device whereby, using an acceptable current through the contact reeds, a comparatively large surface area of the reed contact can be tested for surface contamination.

To this end, the invention a direct current is used as an excitation current during the application of the test current to the reed contact, and the test current is an alternating current having a frequency which continuously varies between a minimum value and a maximum value, respectively less than and greater than a torsional resonant frequency of the reed contact.

The actuation of the reed contact by a frequency equalling the torsional resonant frequency of the reed contact causes the torsional movement produced by the magnetostriction to be maximized, thus causing the testing of a comparatively large surface area of the reed contact. Due to the excitation of the coil by means of a direct current, the contact pressure remains substantially constant so that the contact resistance also remains constant. Testing of the reed contact is thus substantially simplified.

It was found to be advantageous to use a direct current which exceeds the de-energizing direct current (that is, the current at which the relevant reed contact changes over from a closed to an open condition) by a constant percentage. The excitation current thus chosen keeps each reed contact closed at a substantially equal and comparatively low contact pressure. On the one hand, this offers the advantage that the acceptance/rejection criteria are the same for each reed contact, while on the other hand such a method of excitation offers the advantage that torsional movement is not impeded by excessively high contact pressure.

In a preferred method according to the invention, before the test current is conducted through the reed contact, the coil is activated by means of an excitation current such that the material of the constant reeds is magnetically saturated, after which the excitation current is reduced to a hold value which exceeds the value of the de-energizing direct current, after which the current is monotonically reduced, preferably linearly with respect to time, to the value of the de-energizing direct current, while the value of the current when the de-energizing direct current is reached is stored in a store. The coil is subsequently energized again by means of a current which magnetically saturates the material of the contact reeds, and is subsequently reduced to a direct current which exceeds the de-energizing direct current by a constant percentage.

Using this embodiment, the value of the excitation current is comparatively simply determined, the reed contact remaining closed at a relatively low contact pressure during testing. Moreover, during this determination it is established whether or not the reed contact can be closed, because the coil is initially excited by means of a current which magnetically saturates the reed contact.

A device according to the invention, comprises a coil, a power supply unit for exciting the coil and a generater for generating the test current and a detection circuit, the improvement being that the generator is a voltage-controlled oscillator and the detection circuit comprises a bidirectional limit value detector. Because the torsional resonant frequencies of the reed contacts exhibit a spread due to permissible dimensional tolerances, an oscillator having a variable frequency is used, such as a voltage-controlled oscillator. This oscillator is driven by a voltage which varies periodically with respect to time, so that a frequency sweep is obtained which exceeds the spread in the torsional resonant frequency of the reed contacts.

BRIEF DESCRIPTION OF THE DRAWING

The invention will be described in detail hereinafter with reference to the drawing, in which

FIG. 6 is circuit diagram of two power supply sections of the device shown in FIG. 5, FIG. 7 shows a time diagram of a test of a reed contact using a method according to the invention.

DESCRIPTION OF THE PREFERRED EMBODIMENTS

Figure 1:
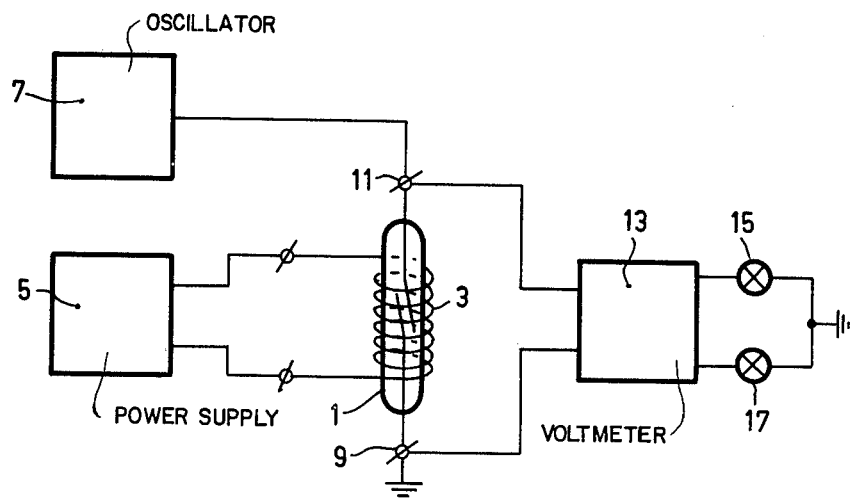
FIG. 1 is a block diagram of a device for testing according to the invention.

As is shown in FIG. 1, a reed contact 1 having contact reeds of magnetostrictive material, such as NiFe, is arranged in a coil 3. The reed contact 1 is closed by the excitation of the coil 3 by means of a power supply unit 5.

An oscillator 7 provides an alternating current which varies in frequency, and is applied through the contact reeds of the closed reed contact 1. The frequency of the alternating current is time-dependent and varies between a maximum value and a minimum value. The minimum frequency and the maximum frequency are chosen to be respectively less than and greater than the torsional resonant frequency of the contact reeds. The torsional movement, which is generally to be assumed to be caused by magnetostriction, is intensified when the test current frequency equals the torsional resonant frequency of the particular reeds being tested. Because the contact area of the contact reeds is displaced over the surface thereof due to the torsional movement, a comparatively large surface area is scanned. If a dust particle which is electrically non-conductive or only poorly conductive is present at the instantaneous contact area, an increased contact resistance is detected. At that instant a higher voltage will occur between the terminals 9 and 11, because the amplitude of the current through the reed contact is constant. The voltage between the terminals 9 and 11 is applied to an absolute value meter 13 which indicates, during and after the measurement, whether the reed contact 1 has a contact resistance which is excessively high or not by means of the indicator 15 or 17.

The oscillator 7 which is diagrammatically shown in FIG. 1 will be described in detail with reference to FIG. 2, parts of the oscillator 7 being denoted therein by the references 30 and 40. The oscillator section 30 comprises a relaxation circuit including an RC circuit 31 and a transistor 32. A series of positive pulses generated on the first base 33 of the transistor 32 is converted into a squarewave signal by a flipflop circuit 35. Using a low-pass filter 37, the squarewave signal is filtered so that the first harmonic, or fundamental frequency, is passed to an amplifier 38. Via output resistor 39, the amplifier 38 supplies an alternating current $i_c$ of constant amplitude which is conducted through a reed contact 1 connected to the resistor 39.

The RC circuit 31 of the relaxation circuit is supplied by means of a control circuit 40 which determines the relaxation frequency. The RC circuit 31 receives a direct voltage having a triangular wave voltage superimposed thereon. The superimposition is obtained by means of a differential amplifier 41 which receives a negative direct voltage and a triangular voltage 59. The value of the direct voltage determines the mean relaxation time of the relaxation circuit. The amplitude of the triangular voltage 59 determines the value of the deviation of the instantaneous relaxation time with respect to the mean relaxation time.

The triangular voltage 59 is generated by an integrator which comprises an amplifier 44 and an RC circuit 43 which is connected to the collector of a transistor 45, the collector alternately carrying a positive and a negative potential. A bistable multivibrator 50 switches the voltage on the base of the transistor 45, through resistor 53, from 0 volts to −12 volts and vice versa. If 0 volts are applied to the base of the transistor 45 through the resistor 53, the transistor 45 will be fully turned on. By choosing the resistors 53 and 49 to be many times larger than the emitter resistor 51, the collector current of transistor 45 is limited, so that a negative potential will appear on the collector of the transistor 45 when the transistor is turned on. If the base of the transistor 45 is connected to −12 volts through the resistor 53, the transistor 45 will be turned off and the collector will be at a positive potential.

The bistable multivibrator 50 is controlled by two amplifiers 55 and 57, the multivibrator 50 reacting to negative voltage pulses. On the output 56 of the amplifier 55 a negative pulse appears if the output voltage 59 fo the integrator 43, 44 becomes more negative than a preset bias voltage 62 which is applied, from a potentiometer 61, to the inverting input of the amplifier 55. By application of the negative pulse to the base of the transistor which is connected to the resistor 53, the multivibrator 50 is set to a first stable position in which the output voltage 52 amounts to 0 volts. The voltage 47 on the collector of the transistor 45 then becomes negative, which causes an increase of the output voltage 59 of the integrator 43, 44. The output voltage 56 of the amplifier 55 thus becomes positive again. Also, the output voltage 58 of the amplifier 57 changes over from positive to negative, if the voltage 59 becomes more positive than the adjusted positive bias voltage 64 which is applied to the non-inverting input of the amplifier 57 by means of a potentiometer 63. Upon change of the amplifier 57 output to negative, the bistable multivibrator 50 will change over from the first stable position to the second stable position. The output voltage 52 of the multivibrator 50 becomes −12 volts, so that the transistor 45 is turned off. The output voltage 47 of the transistor 45 will thus become positive, with the result that the output voltage 59 of the integrator 43, 44 starts to decrease, after which the complete cycle is repeated.

The amplitude and the accuracy of the generated triangular voltage 59 are fixed by the adjusted bias voltages 62, 64 determined by the accuracy of the power supply sources (denoted by + and −) and the potentiometers 61, 63 used.

Figure 2:
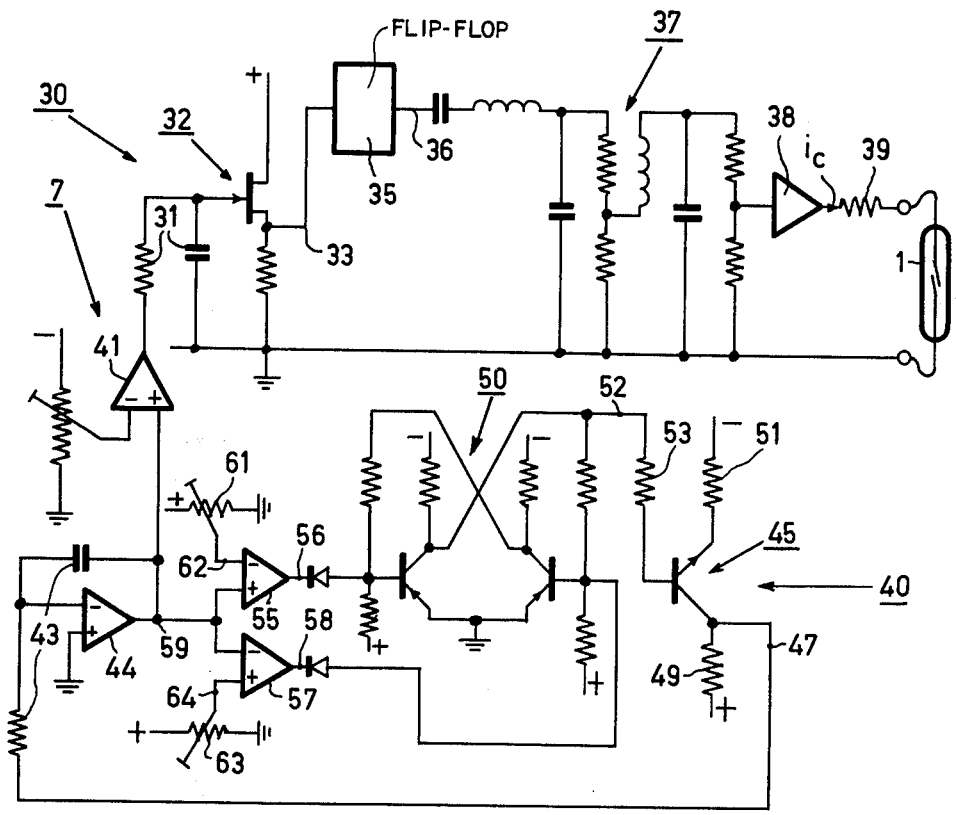
FIG. 2 is a circuit diagram of a voltage-controlled oscillator and the associated control of the device of FIG. 1.
Figure 3:
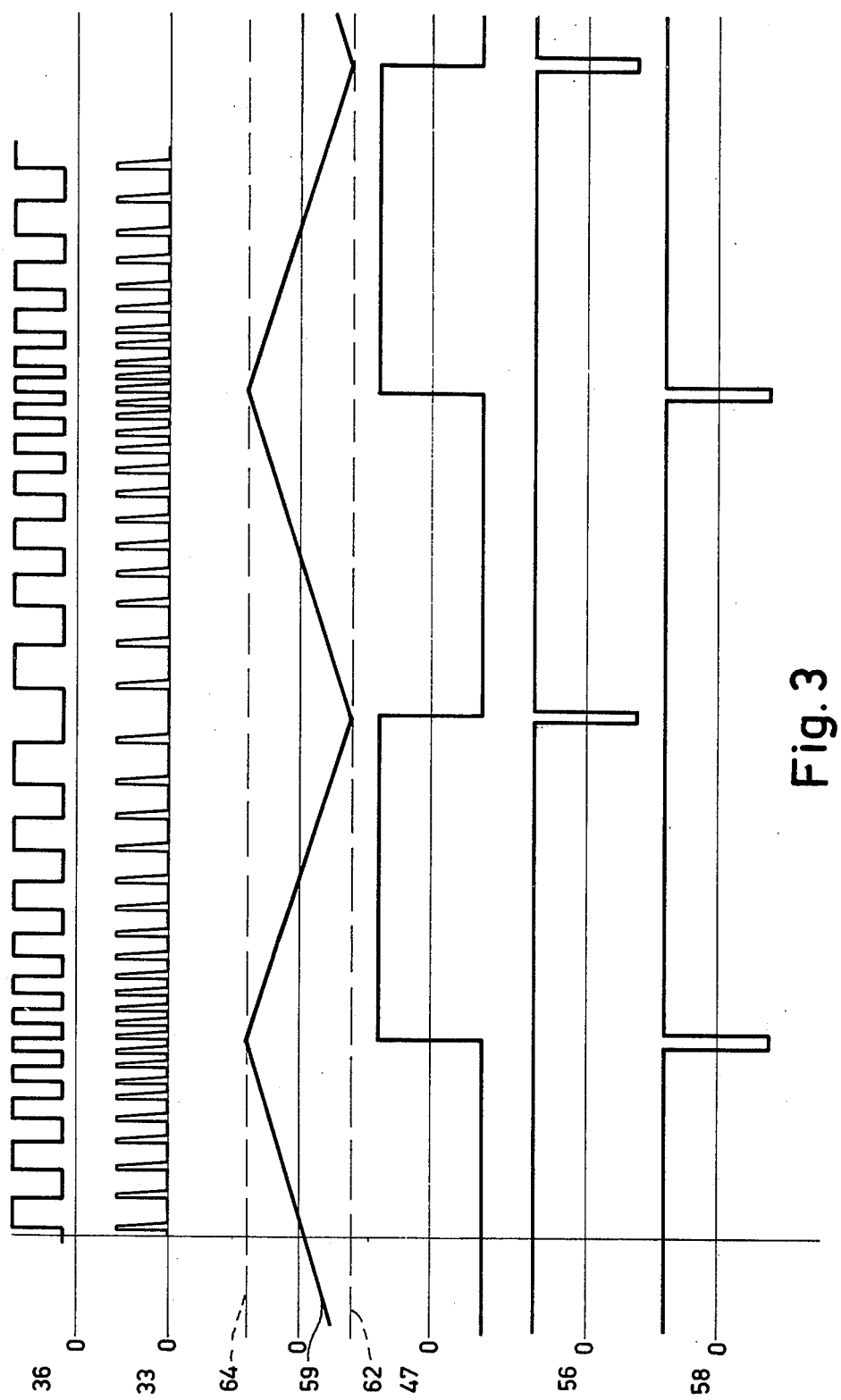
FIG. 3 shows the voltage variation at different points in the circuit shown in FIG. 2 as a function of time.

FIG. 3 shows the variation of various voltages so as to illustrate the operation of the circuit shown in FIG. 2. The trianglar voltage 59, controlling the relaxation circuit 31, 32, is the integral of the squarewave voltage 47. The squarewave voltage 47 is generated by the switching of the transistors 45 via the multivibrator 50. The multivibrator 50 in its turn is controlled by the negative pulse series 56 and 58. The pulse series 56 and 58 are generated by the trianglar voltage 59 when the adjusted bias voltages 62 and 64 are reached. The variation of the relaxation time of the relaxation circuit 31, 32 is dependent of the amplitude of the triangular voltage 59. The pulse series 33 generated by the relaxation circuit 31, 32 is converted into a squarewave voltage 36 by the multivibrator 35. The squarewave voltage 36 is applied to a low-pass filter 37, with the result that a filtered first harmonic signal (not shown) is applied to the amplifier 38.

Figure 4:
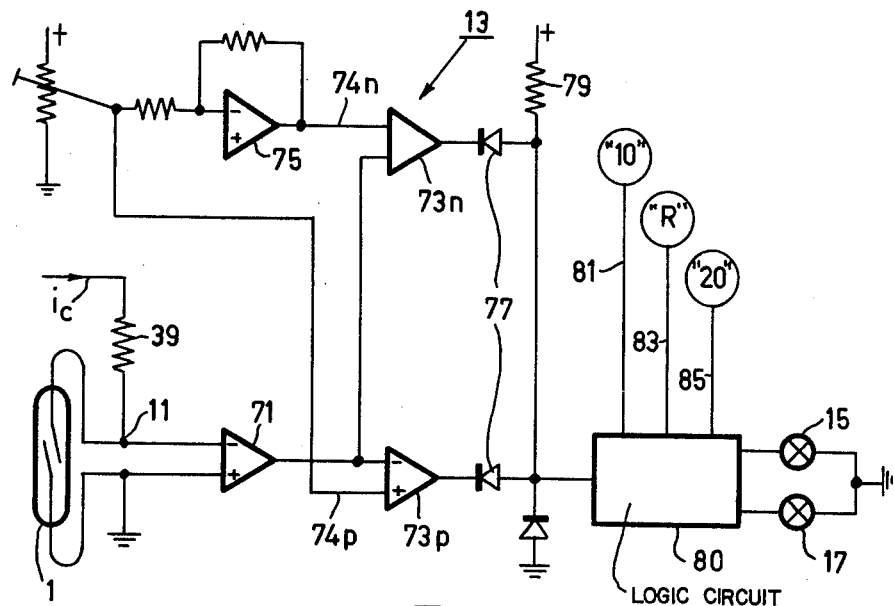
FIG. 4 is a circuit diagram of the detection circuit of the device shown in FIG. 1.

FIG. 4 shows a bi-directional limit value detector 13. Between the terminals 9 and 11 there is connected a read contact 1 wherethrough a test current $i_c$ is conducted by connection to the resistor 39 of the oscillator 7 (not shown). The alternating voltage generated across the closed read contact 1 by the test current $i_c$ is applied to an amplifier 71. The output of the amplifier is connected to two amplifiers 73n, 73p. The amplifier 71 is connected to the inverting input of the amplifier 73p, and to the non-inverting input of the amplifier 73n. The positive half-cycles of the output voltage of the amplifier 71 are compared with a positive direct voltage by amplifier 73p. The amplifier 73p has a negative output signal if the amplitude of the positive direct voltage is lower than that of the positive half-cycles of the alternating voltage. The negative half-cycles of the alternating voltage are compared with a negative direct voltage by the amplifier 73n. The amplifier 73n has a negative output voltage if the amplitude of the negative direct voltage is lower than that of the negative half-cycles of the alternating voltage. If at least one of the outputs of the amplifiers 73n, 73p is negative, a current will flow through the resistor 79, so that the input voltage of a logic circuit 80 decreases from positive to "zero". As a result, indicator 15 will start to operate, indicating an excessive contact resistance of the read contact 1. If the positive and negative half-cycles of the voltage remain below the adjusted limit values, the output of the amplifiers 73n, 73p are positive, so that the diodes 77 are both turned off. The logic circuit 80 receives a positive signal and the indicator 17 indicates that the contact resistance of the reed contact 1 tested remains below the adjusted limit value.

The logic circuit 80 is controlled through the inputs 81, 83 and 85. The logic circuit 80 is set to a starting condition by means of a signal "R"from input 83. Upon application of a Signal "10" from the input 81, the access to the logic circuit 80 is permitted for a signal generated by the amplifiers 73p, 73n. Upon receipt of a signal "20", on input 85 a signal received by the logic circuit 80 is applied to the indicators 15 or 17, in accordance with the nature of the signal originating from the tested reed contact 1.

The signals "R", "10" or "20" are shown as a function of time in FIG. 7 which depicts one measurement cycle of a device which will be described with reference to the FIGS. 5 and 6.

Figure 5:
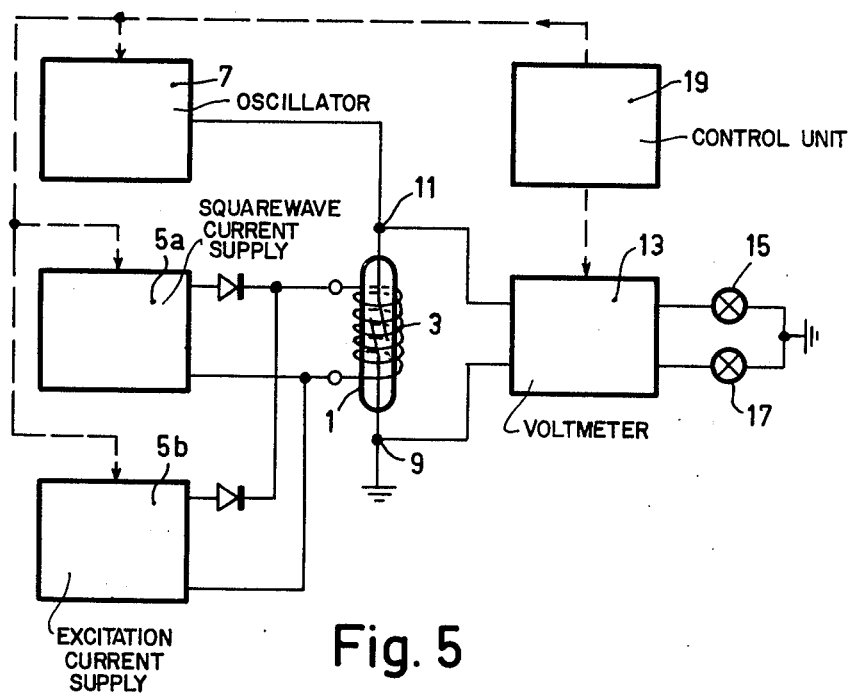
FIG. 5 is a block diagram of a preferred embodiment of a device for testing according to the invention.

The block diagram shown in FIG. 5 is an elaboration of the diagram shown in FIG. 1. There is an addition in the form of a control unit 19 which determines which sections of the device operate at what instant and in what manner. The power supply unit 5 of FIG. 1 is sub-divided into two supply sections 5a and 5b. The supply section 5a generates a squarewave excitation current, and the section 5b generates a desired excitation current for coil 3 which is adapted to a reed contact 1. The control unit 19 comprises a pulse generator and pulse dividers which generate, by means of gate circuits, pulse cycles for controlling the sections 5a, 5b, 7 and 13 of the device, for example, as already described for the logic circuit 80 shown in FIG. 4.

The circuit of the supply sections 5a and 5b shown in the form of a block diagram in FIG. 5 is shown more completely in FIG. 6, and the operation thereof will be described with reference to this Figure. The time diagrams shown in FIG. 7 are used for the sake of clarity. The transistor 90 is turned on or off by means of a pulse cycle "1" (FIG. 7) of the control unit 19. The amplitude of the squarewave excitation current for the coil 3 (see FIG. 5) is adjusted by means of the resistor 91.

The power supply section 5b generates another component of excitation current for the coil 3 which is adapted to the mechanical spring properties of the reed contact 1 in order to obtain a substantially equal contact pressure for all reed contacts to be tested. This is important because the contact pressure affects the contact resistance, and an excessively high contact pressure impedes the torsional movement of the contact reeds.

In order to enable the use of a uniform test threshold or limit value for the reed contacts to be tested, all reed contacts should have a substantially equal contact pressure during the test. The electronic circuit of the supply section 5b serves this purpose. First it is determined at which current though the coil 3 the reed contact 1 is opened. Subsequently, a desired percentage is added to this given current intensity, thus producing an excitation which is adapted to the rigidity of the reed contact 1 and which produces a substantially equal contact pressure for all reed contacts tested.

To reset the circuit 5b, a pulse cycle "O" from the control unit 19, temporarily energizes a relay 95 (see FIG. 6) so that a contact 95a is closed. Through a resistor 96, a capacitor 97 is discharged, after which the contact 95a is opened again. The capacitor 97 constitutes, in conjunction with the amplifier 99, an integrator which, due to the described discharge procedure, has the same starting position for each measuring cycle. The initial output voltage 100 of the integrator is 0 volts. As a result, a transistor 101 is turned off. The collector voltage of the transistor 101 is positive, so that an AND gate 102 turns on the transistor 103 as soon as the control unit 19 applies the pulse cycle "2" to the second input of the AND gate. When the transistor 103 is turned on, the capacitor 97 is charged. As a result, the transistor 101 is then turned on and the AND gate circuit 102 is turned off, so that the transistor 103 is turned off. The capacitor 97 will remain fully charged until a pulse cycle "3" is applied to the gate circuit 196 by the control circuit 19.

While the capacitor 97 is charged, the potential 100 which is then positive is applied, via the amplifier 109, to the base of transistor 111, so that an excitation current starts to flow through the coil 3 via the transistor 111 and the resistor 113. If the transistor 90 is turned off by change of state of the "1" input, the reed contact 1 will still be closed.

Because the base of a transistor 105 is connected to ground through a normally closed relay contact 104a and the reed contact 1, the transistor 105 will be turned off. Therefore, a positive voltage is present on the collector 105 and hence on a first input of AND gate 106. The gate circuit 106 will turn on the transistor 107 in reaction to the pulse cycle "3" from the control circuit 19, As a result, the capacitor 97 will be slowly discharged, so that the positive potential on the point 100 slowly deceases. The excitation current through the transistor 111 will slowly decrease, until the value is reached at which the reed contact 1 just opens. Upon removal of the ground connection through the reed contact, transistor 105 is turned on by application of a positive voltage through the resistor 205 to the base, thus causing the transistor 107 to be turned off. The capacitor 97 is not further discharged, and the potential present at point 100 at that instant is maintained, thus storing the value of de-energizing current.

If a pulse cycle "8" is applied to a transistor 115 by the control unit 19, a relay 116 is energized and contact 116a is closed. Through a resistor 108b and a potentiometer 117, a percentage of the potential 100 which is linearly related to the de-energizing current is applied to amplifier 109. The resistors 108a, 108b and 108c constitute, in conjunction with the amplifier 109, an adding circuit, so that the transistor 111 starts to carry a current which equals the current at which the reed contact 1 just opens, increased by an adjusted percentage. The closed reed contact 1 is the connected, via a contact 104a of the relay 104, which is operated by the pulse cycle "9" from the control circuit 19, to the output resistor 39 of the alternating voltage generator (not shown) and to the input of the detector 9 (not shown). FIG. 7 shows various pulse cycles "0" to "20" and clearly illustrates their relationship. There is also shown a graph of the excitation current through the coil 3 of FIG. 6.

During the first 10 ms, the capacitor 97, FIG. 6, is discharged and the logic circuit 80 (see FIG. 4) is set to the starting condition.

Between instants 10 ms and 30 ms, the coil 3, FIG. 6, is excited by means of a squarewave current, and the capacitor 97, FIG. 6, is charged.

Between instants 30 ms and 80 ms, the capacitor 97, FIG. 6, is slowly discharged and the current at which the reed contact 1 opens is determined.

Between instants 80 ms and 100 ms, the coil 3 is excited by the maximum current because of a second "1" pulse shown; at the instant 90 ms the relay 104 connects the reed contact 1 to the alternating voltage generator 7 and the detector 9, FIG. 5. As from instant 100 ms, the reed contact 1 is tested, the coil being excited by the current which was adapted to the reed contact 1 in response to the pulse "8".

Between instants 100 ms and 200 ms, a detection signal can be detected by the logic circuit 80, FIG. 4. As from instant 200 ms till the end of the measurng cycle, the result can be read by means of the indicators 15 and 17.

Figure 8:
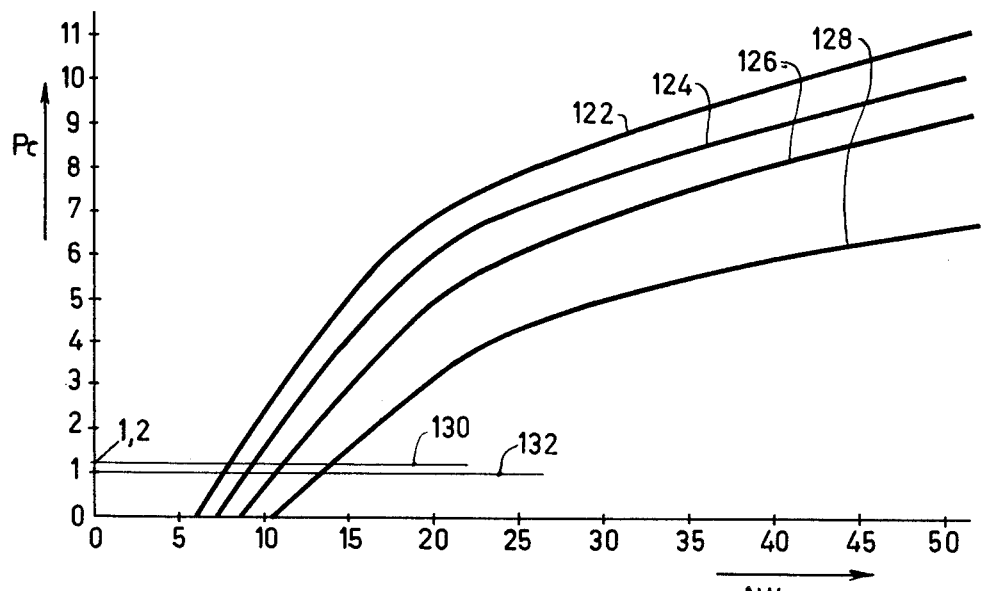
FIG. 8 illustrates to what extent an equal contact pressure can be obtained for different reed contacts.

So as to illustrate the difference in contact pressure which may occur at the same excitation, FIG. 8 shows the contact pressure Pc (in gf) as a function of the excitation AW (in ampere-turns) for four arbitrarily chosen reed contacts 122, 124, 126 and 128. FIG. 8 also shows that for each reed contact a substantially equal contact pressure is obtained if a given percentage is added to the number of ampere-turns at which a reed contact is about to open. For example, if 33% is added to the said number of ampere-turns, all contacts 122, 124, 126 and 128 will be subject to a contact pressure of 1.2 gf, which is illustrated by means of a line 130. Line 132 illustrates the contact pressure $P_c$ (1 gf) which arises if 25% is added to the said number of ampere-turns.

Figure 9:
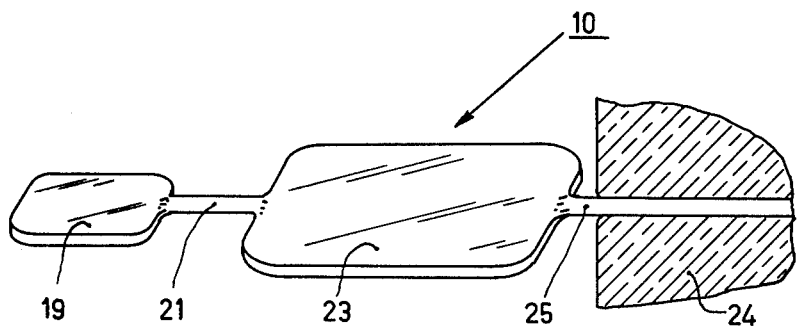
FIG. 9 is a perspective view of a contact reed suitable for being tested according to the invention, and FIGS. 10a, b, c illustrates the various phases of a selection procedure for reed contacts using a method according to the invention.

FIG. 9 shows an embodiment of a reed 10 of a reed contact 1 which can be successfully tested using the method described in this specification. The contact reed 10 shown consists of a flat contact portion 19, a stem 21, a flat portion 23 which acts as a hinge, and a stem end 25. The stem end 25 is molded into the glass of an hermetically sealed envelope 24 (partly shown).

The torsional resonant frequency can be calculated from the dimensions of the contact reed 10, the specific mass and the rigidity of the material. The contact reed shown has the following dimensions.

Flat contact portion 19: length: 20, width: 0.9, thickness 0.3 mm.

Hinge 23: Length: 33, width: 1.6, thickness: 0.16 mm

Stem 21: length: 1.8, diameter: 0.6 mm.

The contact reed is made of nickel (50%) iron (50%).

If it is assumed that the embedded stem end 25 approximates complete clamping, the calculated torsional resonant frequency is 31.6 kHz.

Measurements have revealed that the mean torsional resonant frequency deviates little indeed from the calculated theoretical value, the spread occurring being less than 2 kHz.

The bending resonant frequency of the contact reed 10 can also be calculated. This frequency is approximately 2 kHz. Because each reed contact of a different construction, different dimension, different material, has a different torsional resonant frequency, the mean frequency, the maximum frequency and the minimum frequency of the alternating voltage generator 7 of FIGS. 1 and 5 have been made adjustable. The desired frequency band can be readily adjusted in the potentiometers shown in FIG. 2.

In accordance with a preferred method according to the invention shown graphically in FIG. 10, the detection of poorly conductive contaminant material during the torsional resonance of the contact reeds (phase C) is preceded by phases A and B yet to be described. During phase A (FIG. 10a) the reed contacts are kept in a closed condition for 3 to 5 seconds by means of a coil 3A. The excitation current of the coil 3A consists of a direct current having an alternating current superimposed thereon. The frequency of the alternating current corresponds to the bending resonant frequency of the reed contact 1. The amplitude of the alternating current is lower than that of the direct current. The magnetic field which is generated by the superimposition of the two currents and which is oriented in the longitudinal direction of the reed contact has a fluctuating intensity but keeps the reed contact closed. The fluctuating component of the magnetic field causes the flat contact portions to slide one over the other as the contact pressure increases and decreases.

Due to the provision of a diffused surface, such as in the form of a gold layer, the contact reeds have a non-smooth contact surface. It is suspected that irregularities of the contact surface, which are comparatively large with respect to the means roughness, suppress the torsional movement of the contact reeds. As a result, the contact surface would only be partly sensed by the test method described above. When the flat contact portions slide over each other, the contact surfaces are smoothed so that the said suppression of the torsional movement is precluded. The smoothing of the contact surfaces also offers the advantage that the contact reeds have a more constant behavior with regard to the excitation required for the closing and opening of the reed contact.

Among the causes of poorly conductive particles or layers on the contact reeds are the treatments of the contact reeds during manufacture. On the basis of microscopic investigations it is suspected that contaminants are rubbed into the irregularities of the contact surface during the smoothing of the contact surfaces. It is believed that this material will be released by the commonly applied method of switching using substantially squarewave switching pulses. Therefore, after the smoothing process the reed contacts are subjected to a test under approximated conditions. During this test (phase B) a large number of reed contacts are simultaneously arranged in a large coil 3B. The excitation current which the coil 3B is excited produces a magnetic field which is a squarewave having a frequency of 55 Hz. The magnetic field causes an abrupt closing and opening of the reed contacts, the intensity of the magnetic field not being changed during the closed condition of the reed contact. The sliding of the flat contact portions over each other is thus prevented during the phase B, so that the inpurities rubbed into the surface during the phase A become loose and cannot be rubbed into the surface again. As a result, the released impurities can be detected. The loosening of impurities covers more than 100,000 switching operations. During the phase B the reed contacts are turned over 180° with respect to the gravitational field of the earth, together with the coil 3B, in order to bring as many loose dirt particles as possible between the flat contact portions where they can be detected.

The phases A and B are followed by the detection phase during which the reed contact 1 is tested for proper operation. The test cycle and the operation of the test device have already been described in detail. For the sake of clarity, FIGS. 10a, b and c show the various test and excitation currents underneath the associated, diagrammatically shown phase.

Tests were performed on 10,000 read contacts. Of this sample, 0.2% had an increased contact resistance due to electrically poorly conductive material on the flat contact portions. Another 0.2% exhibited catastrophic defects, which means that they could not be closed or opened after some time of operation.

Using only the detection phase C, 26% of the reed contacts tested were rejected. These 26% included 75% of all contacts having future catastrophic defects.

The testing of reed contacts where the detection phase C was preceded by vibration phase B, produced the following result: rejected 20%, including all reed contacts having future catastrophic defects.

Of the reed contacts tested according to the preferred sequence of phase A, vibration phase B and detection phase C, 9% were rejected, including all reed contacts having catastrophic detects.

For comparison it is known that by microscopic inspection of reed contacts approximately 15% of all reed contacts are rejected, only 60% of all reed contacts having future catastrophic defects being found during such an inspection.

What is claimed is:

1. A method of testing contact surfaces of reed switches having electrically conductive contact reeds comprising a magnetostrictive material and susceptible to torsional movement upon application of a magnetic field by a coil within which the switch is located, comprising
applying an excitation current which is a direct current to said coil so as to close contacts of said switch,
applying an alternating test current through said closed contacts, and
continuously varying the frequency of said test current between a minimum value less than a torsional resonant frequency of said contact and a maximum value greater than said torsional resonant frequency.

2. A method as claimed in claim 1 wherein said excitation current has a value which is a given constant percentage greater than a de-energizing direct current at which the reed contact under test changes from a closed to an open position.

3. A method as claimed in claim 1 wherein said excitation current has a de-energizing value at which the reed contact under test changes from a closed to an open position, said method comprising in addition the sequential steps of
activating the coil with an excitation current of first value such that the magnetostrictive material is magnetically saturated, reducing said excitation current from said first value to a second value greater than said de-energizing value,
reducing said excitation current monotonically with time to said de-energizing value.
storing said value of de-energizing current,
again activating the coil with an excitation current sufficient to magnetically saturate said magentostrictive material, and
reducing the excitation current to a third value having a given constant percentage greater than said de-energizing value, said third being said direct current excitation current.

4. A method as claimed in claim 1 comprising applying a vibrating current to said coil before said excitation current, said vibrating current having a frequency less than the bending resonant frequency of the reed, the vibrating current producing a square wave magentic field intensity so as to open and close said contacts.

5. A method as claimed in claim 4 wherein said vibrating current is maintained such that said reed contact is closed and opened at least 10,000 times.

6. A method as claimed in claim 1 wherein said applying of vibrating current is preceded by the step of applying a switching current to said coil, said switching current having a direct current component and an alternating current component superimposed thereon, the alternating current having a frequency substantially equal to the bending resonant frequency of the reeds and a peak value less than the direct current component.

7. A testing device for reed switches, comprising a coil, power supply means for exciting the coil, a generator for generating a test current, means for conducting said test current to contacts to be tested, and detection means for detecting poor contact between said contacts, wherein said generator comprises a voltage controlled oscillator and said detection means comprises a bi-directional limit value detector.

8. A device as claimed in claim 7, comprising in addition a control unit, and wherein said power supply means comprises two independent supply section means controlled by said control unit for generating in succession a squarewave excitation current which changes to a linearly decreasing excitation current which decreases to a minimum value at which a contact reed being tested just opens, and a second squarewave excitation current which changes to a constant excitation current having a value which exceeds said minimum value by a constant percentage, one of said supply section means generating the squarewave excitation currents and the other section generating the current which decreases and the constant current.

* * * * *

UNITED STATES PATENT AND TRADEMARK OFFICE
CERTIFICATE OF CORRECTION

PATENT NO. : 4028615
DATED : June 7, 1977
INVENTOR(S) : FRIEDRICH LUDWIG JENSEN ET AL It is certified that error appears in the above-identified patent and that said Letters Patent are hereby corrected as shown below:

Column 1, line 16, after "closed" insert --,-- (comma)

Column 1, line 28, "tht" should be --that--

Column 1, line 55, after "end," insert --according to--

Claim 3, line 19, after "third" insert --value--

Claim 6, line 1, "claim 1" should be --claim 4--

Signed and Sealed this

Fourth Day of July 1978

[SEAL]

Attest:

RUTH C. MASON
Attesting Officer

DONALD W. BANNER
Commissioner of Patents and Trademarks